(12) United States Patent
Mazumdar et al.

(10) Patent No.: US 11,942,953 B2
(45) Date of Patent: Mar. 26, 2024

(54) DROOP DETECTION AND CONTROL OF DIGITAL FREQUENCY-LOCKED LOOP

(71) Applicants: Advanced Micro Devices, Inc., Santa Clara, CA (US); ATI Technologies ULC, Markham (CA)

(72) Inventors: Kaushik Mazumdar, Waltham, MA (US); Joyce Cheuk Wai Wong, Toronto (CA); Naeem Ibrahim Ally, Mississauga (CA); Stephen Victor Kosonocky, Fort Collins, CO (US)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 180 days.

(21) Appl. No.: 17/557,590

(22) Filed: Dec. 21, 2021

(65) Prior Publication Data

US 2023/0198528 A1    Jun. 22, 2023

(51) Int. Cl.
*H03L 7/08* (2006.01)
*H03L 7/085* (2006.01)

(52) U.S. Cl.
CPC ............ *H03L 7/0805* (2013.01); *H03L 7/085* (2013.01)

(58) Field of Classification Search
CPC ............................... H03L 7/0805; H03L 7/085
See application file for complete search history.

(56) References Cited

U.S. PATENT DOCUMENTS

| 7,394,288 | B1 | 7/2008 | Agarwal | |
|---|---|---|---|---|
| 11,036,253 | B1* | 6/2021 | Paternoster | ............... G06F 1/10 |
| 11,630,161 | B1* | 4/2023 | Rodriguez | ............... H03M 3/30 |
| | | | | 324/764.01 |
| 11,677,404 | B1* | 6/2023 | Harush | ................... H03L 7/093 |
| | | | | 327/159 |
| 2004/0017234 | A1* | 1/2004 | Tam | ........................ G06F 1/324 |
| | | | | 327/141 |

(Continued)

FOREIGN PATENT DOCUMENTS

KR    20220063579 A    * 11/2020

OTHER PUBLICATIONS

International Search Report and Written Opinion for International Application No. PCT/US2022/052658 dated Apr. 28, 2023, 7 pages.

*Primary Examiner* — Adam D Houston
(74) *Attorney, Agent, or Firm* — Polansky & Associates, P.L.L.C.; Paul J. Polansky; Nathan H. Calvert

(57) ABSTRACT

A apparatus includes a reference signal generator, a droop detection circuit, a digital frequency-locked loop (DFLL), and a DFLL control circuit. The reference signal generator that receives a digital value and produces a pulse-density modulated signal based on the digital value. The droop detection circuit converts the pulse-density modulated signal to an analog signal, compares the analog signal to a monitored supply voltage, and responsive to detecting a droop of the monitored supply voltage below a designated value relative to the analog signal, produces a droop detection signal. The DFLL provides a clock signal for synchronizing circuitry within a domain of the monitored supply voltage. The DFLL control circuit, responsive to receiving the droop detection signal, causes the DFLL to slow the clock signal.

25 Claims, 9 Drawing Sheets

(56) References Cited

U.S. PATENT DOCUMENTS

| | | | |
|---|---|---|---|
| 2013/0315349 A1* | 11/2013 | Nguyen | H04L 7/033 |
| | | | 375/340 |
| 2015/0002197 A1 | 1/2015 | Chatterjee et al. | |
| 2018/0054205 A1 | 2/2018 | Chen et al. | |
| 2019/0199363 A1 | 6/2019 | Kosonocky et al. | |
| 2019/0317546 A1* | 10/2019 | Born | G06F 1/08 |
| 2019/0319609 A1* | 10/2019 | Wong | H03K 5/1508 |
| 2022/0166436 A1* | 5/2022 | Labbe | G06F 1/28 |
| 2023/0195191 A1* | 6/2023 | Mazumdar | H03K 19/00361 |
| | | | 713/340 |
| 2023/0198528 A1* | 6/2023 | Mazumdar | H03L 7/0805 |
| | | | 326/99 |

* cited by examiner

DROOP DETECTION AND CONTROL OF DIGITAL FREQUENCY-LOCKED LOOP

BACKGROUND

Integrated circuits and discrete circuits include terminals for receiving power from a power supply to provide a source voltage for the associated circuitry. A circuit, for example an inverter, is often connected between the supply and circuit common or ground. In the case of metal-oxide semiconductor field-effect transistors (MOSFETs), a specified voltage at a gate terminal activates the transistor to create a circuit path to drive circuit elements connected between an output terminal and the supply or ground and to drive the operation of subsequent circuits connected to the output terminal. Typically, the amount of current and circuit loading is related to both the operation speed and power supply voltage. Because of the active nature of many circuits, the loading will sometimes vary and, at times, may cause a supply voltage level to drop or be lowered from the desired level.

Voltage droop is a term used to refer to the drop in voltage from the desired voltage level as the supply drives a load. In a regulated system, the output voltage can sag when a load is suddenly increased very rapidly. For example, a transient loading condition may occur causing a voltage droop. If the droop is too large, then circuit failure results.

In prior art systems, supply adjustment circuits, or "header" circuits, are operably disposed between a supply and a circuit and are regulated to adjust or compensate for such variations in the supply. For example, some solutions include header circuits that constantly switch at a relatively high frequency relative to other power management features such as power state changes, in order to minimize the loading from the transient response and to regulate the supply voltage. These header circuits are often optimized to respond very quickly to voltage droops due to transient loading conditions and other loading conditions.

These prior art systems typically have substantial customized analog design blocks and add significant overhead as they switch in and out of connecting relatively large field effect transistors in order to respond to transient loading conditions. This overhead even occurs when operating in a steady-state mode. Thus, such systems not only consume precious integrated circuit real estate, but also are inefficient from a power perspective.

BRIEF DESCRIPTION OF THE DRAWINGS

FIG. 8 shows a flow diagram showing the operation of an electrical design current mitigation process according to some implementations which provide reduced power consumption for;

Figure 1:
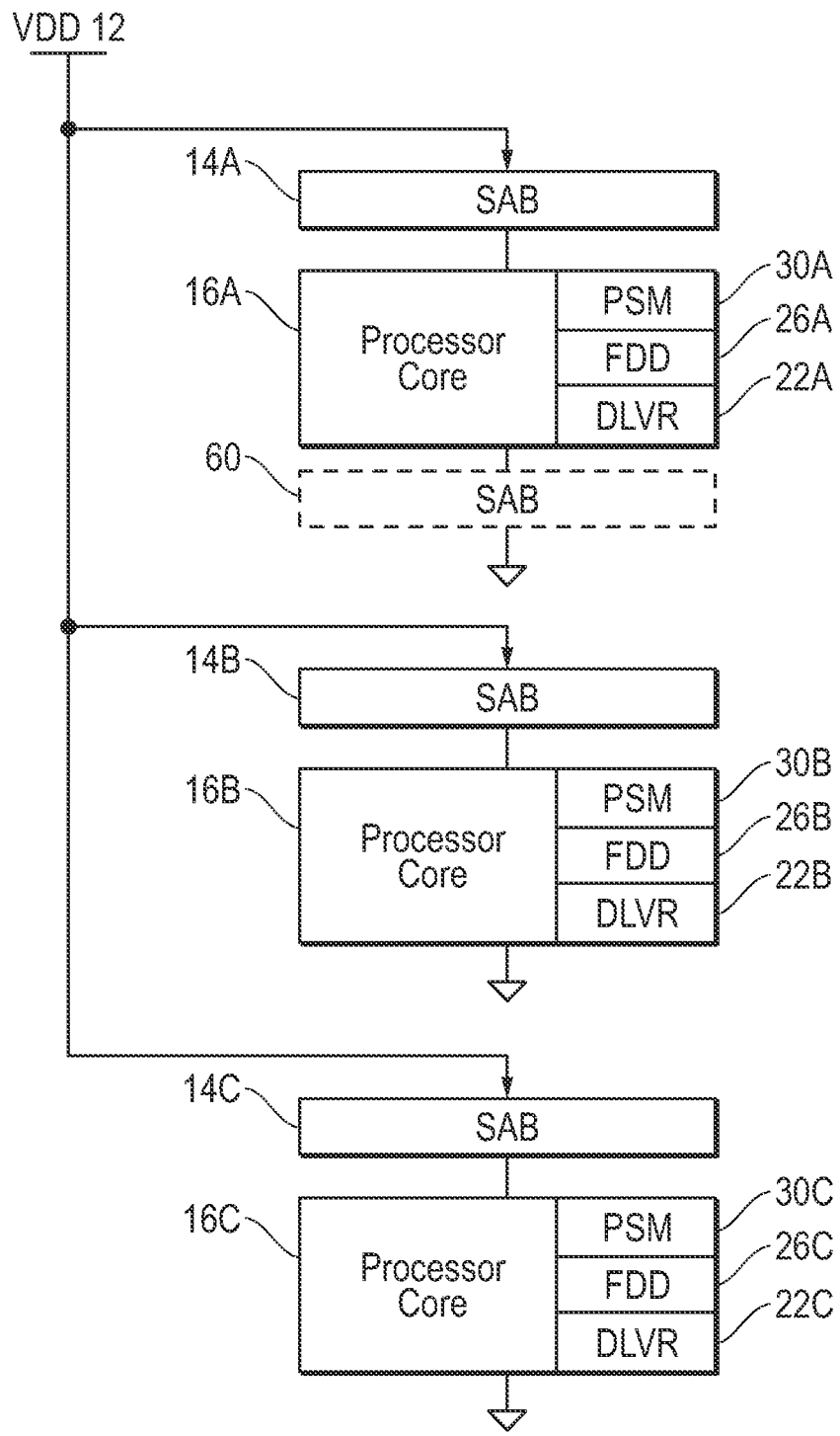
FIG. 1 illustrates, in block diagram form, a system for regulating supply voltages to a plurality of processor cores according to the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate implementations using suitable forms of indirect electrical connection as well.

DETAILED DESCRIPTION

An apparatus includes a reference signal generator, a droop detection circuit, a digital frequency-locked loop (DFLL), and a DFLL control circuit. The reference signal generator that receives a digital value and produces a pulse-density modulated signal based on the digital value. The droop detection circuit converts the pulse-density modulated signal to an analog signal, compares the analog signal to a monitored supply voltage, and responsive to detecting a droop of the monitored supply voltage below a designated value relative to the analog signal, produces a droop detection signal. The DFLL provides a clock signal for synchronizing circuitry within a domain of the monitored supply voltage. The DFLL control circuit, responsive to receiving the droop detection signal, causes the DFLL to slow the clock signal.

A method monitors a power supply. The method includes receiving a binary number and creating a pulse-density modulated signal scaled based on the binary number. The pulse-density modulated signal is converted to an analog signal, and compared to a monitored supply voltage. Responsive to detecting a droop in the monitored supply voltage below a designated value relative to the analog signal, a droop detection signal is produced. Responsive to the droop detection signal, the method causes a digital frequency-locked loop (DFLL) that provides a clock signal for synchronizing circuitry within a domain of the monitored supply voltage to slow the clock signal.

A data processing system, includes an integrated circuit with at least two processor tiles. Each processor tile includes digital logic, a local DFLL providing a clock signal for synchronizing the digital logic, and a local power supply monitor for monitoring a respective monitored local supply voltage. Each power supply monitor includes a reference signal generator, a droop detection circuit, and a DFLL control circuit. The reference signal generator receives a digital value and produces a pulse-density modulated signal based on the digital value. The droop detection circuit converts the pulse-density modulated signal to an analog signal, compares the analog signal to the respective monitored local supply voltage, and responsive to detecting a droop of the respective monitored local supply voltage below a designated value relative to the analog signal, produces a droop detection signal. The DFLL control circuit, responsive to receiving the droop detection signal, causes the local DFLL to slow the clock signal.

FIG. 1 illustrates, in block diagram form, a system for regulating supply voltages to a plurality of processor cores according to the prior art. A supply voltage VDD 12 is connected to a plurality of supply adjustment blocks (SAB) 14A-C. Each of the supply adjustment blocks 14A-C is connected to produce an adjusted supply voltage to a processor core 16A-C. Each of the processor cores 16A-C includes a power supply monitor (PSM) 30A-C, a fast droop detector (FDD) 26A-C, and a digital low voltage regulator (DLVR) 22A-C. Each DLVR 22A-C is formed within the processor core 16A-C, respectively. The processor cores and their associated circuitry may be referred to as a "processor tile".

In some versions, a supply adjustment block (SAB) 60 may be used either in addition to or in place of a supply adjustment block 14. As may be seen, supply adjustment block 60 is a footer circuit rather than a header circuit meaning that the supply adjustment block is connected between the processor core and ground instead of being connected between the processor core and the supply. In versions of the system of FIG. 1 where a supply of adjustment block 60 is included, the specific discrete logic is modified to support the desired operations and one of average skill in the art may readily make such transformations in design. The first regulators (22A-C) and FDD (26A-C) would remain the same. Thus, for example, a charge inject signal generated by FDD 26A-C would serve to activate or select resistive elements within supply adjustment block 60. While only one supply adjustment block 60 is shown in dashed lines, it should be understood that a plurality of supply adjustment blocks 60 could be included in the version of FIG. 1. As with a supply adjustment block 14 comprising a header circuit, a second regulator, namely FDD 26A-C, generates a charge inject signal that causes selected resistive elements to be activated to adjust the voltage drop across the supply adjustment block 14A-C and therefore to adjust voltage produced to the processor core 16A-C.

Figure 2:
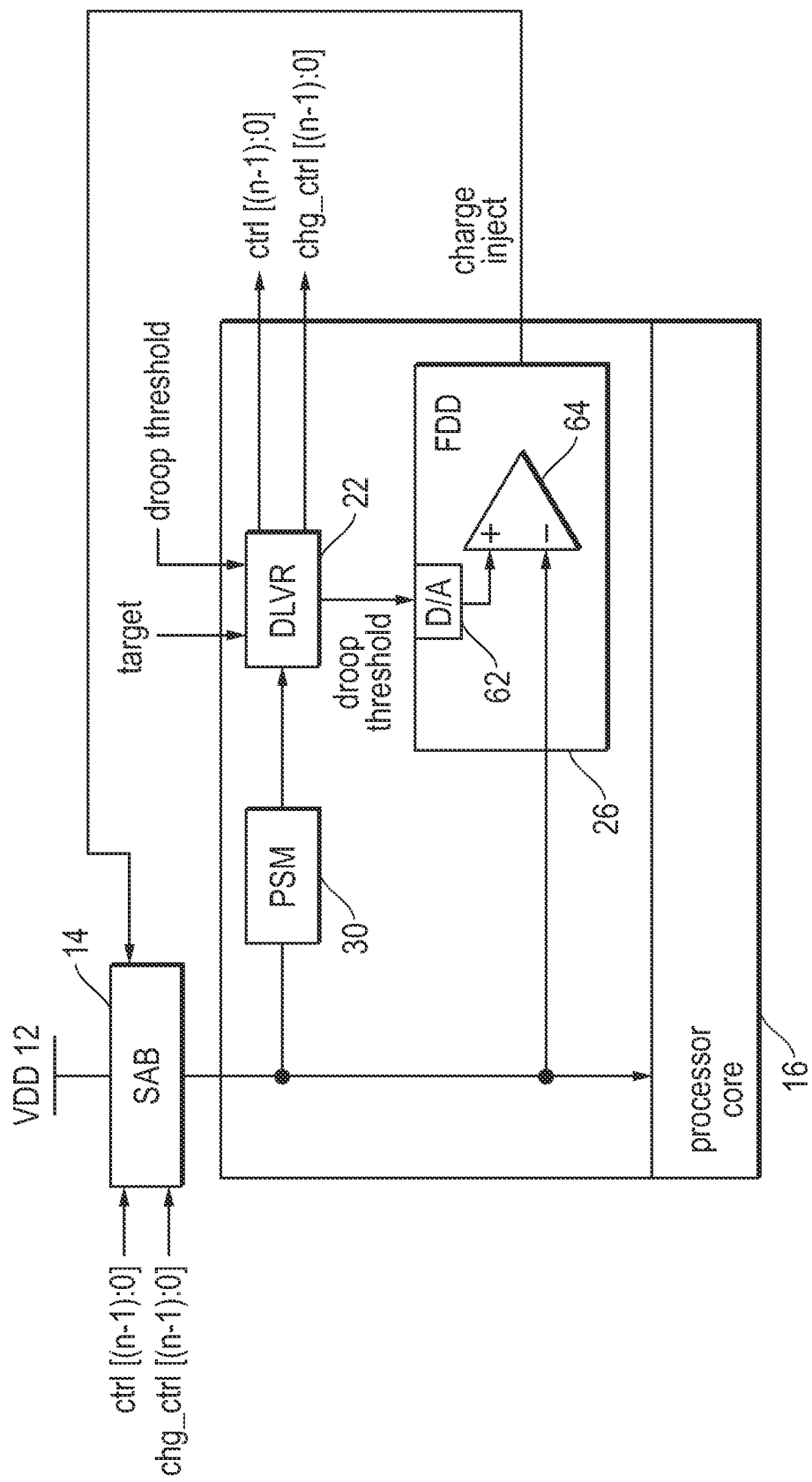
FIG. 2 illustrates, partially in block diagram form and partially in schematic form, further details of a regulator system that compensates for droop according to the prior art.

FIG. 2 illustrates, partially in block diagram form and partially in schematic form, further details of a regulator system that compensates for droop according to one implementation of the invention. A supply voltage VDD 12 is connected to supply adjustment block 14 that in turn produces the adjusted supply voltage to processor core 16. The magnitude of the adjusted supply voltage is based upon the values of a control word, a charge control word and the charge inject signal generated by FDD 26 (illustrated as additional inputs to SAB 14). In the described version, PSM 30, DLVR 22, and FDD 26 are all formed within processor core block 16 in the version of FIG. 2.

The adjusted supply voltage is provided to PSM 30 that in turn produces the digital representation of the adjusted supply voltage magnitude to DLVR 22. The adjusted supply voltage is also produced to FDD 26. DLVR 22 is further connected to receive the target adjusted supply voltage, shown as "target", and the droop threshold level from an external source. The external source may be a power management block in one implementation. DLVR 22 produces the droop threshold level to FDD 26. DLVR 22 also produces the control word "ctrl [(n−1):0]" and the charge control word "chg_ctrl [(n−1):0]" to supply adjustment block 14.

FDD 26 includes a digital-to-analog converter (DAC) 62 that is connected to receive the droop threshold level from DLVR 22 and is configured to produce an analog signal whose magnitude corresponds to the received droop threshold level to a plus (+) input of a comparator 64. In the depicted version, DAC 62 is a sigma-delta converter. A minus (−) of comparator 64 is connected to receive the adjusted supply voltage produced by supply adjustment block 14. Comparator 64 generates the charge inject signal that activates the supply adjustment block 14 whenever the adjusted supply voltage falls below the analog droop threshold level or voltage. It should be noted, in the charge selection block utilizes NAND logic, a logic one for the charge injection signal triggers the charge injection or, more specifically, supply voltage adjustment for a selected MOSFET. A logic zero is only generated when the droop threshold is lower than the adjusted supply voltage. It should also be noted that the version of FIG. 2 includes a first regulator (DLVR 22) formed within processor core block 16. In an alternative version, the first regulator, namely DLVR 22, may be formed outside of processor core 16.

FDD 26 performs its processing very quickly by performing an analog comparison of the adjusted supply voltage and the droop threshold. Accordingly, the charge injection signal may be generated nearly instantly and may be generated much more quickly than processor-based digital logic that requires a number of clock cycles to obtain all necessary data and to process the data. As such, the second control loop that includes FDD 26 is a fast-acting control loop to immediately correct or regulate the adjusted supply voltage whenever the adjusted supply voltage falls below the droop threshold level. The first regulation loop, in contrast, that includes the first regulator (DLVR 22), is a slower acting loop that compares the adjusted supply voltage to a target adjusted supply voltage value. By utilizing a fast acting second control loop with FDD 26, a simpler and slower first regulation loop may be utilized to reduce IC real estate and associated power consumption. Moreover, because the decision-making in the second control loop is made in analog (real time), the first control loop may be clocked at a lower rate thereby saving power.

Figure 3A:
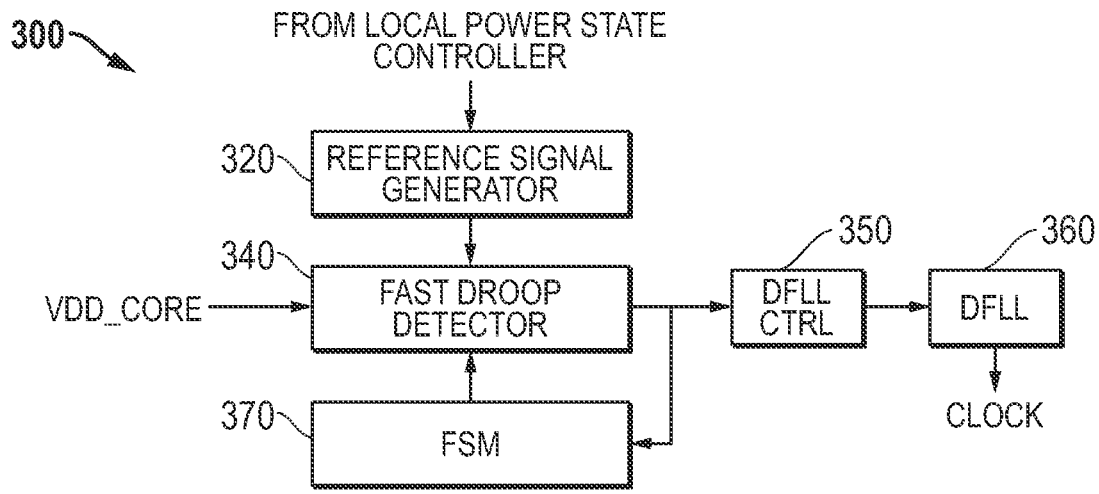
FIG. 3A illustrates a block diagram of a power supply monitor which is able to more quickly respond to voltage droops according to some implementations.
Figure 3B:
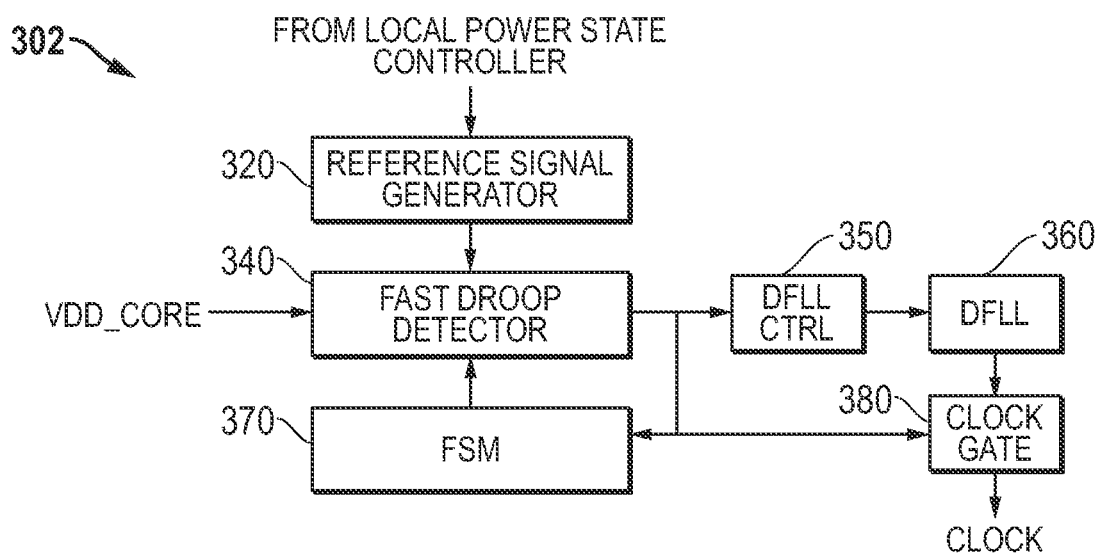
FIG. 3B shows in block diagram form a power supply monitor according to additional implementations.

FIG. 3 illustrates in block diagram form two implementations of a power supply monitor, labeled 300 (FIG. 3A) and 302 (FIG. 3B), according to some implementations. Power supply monitor 300 includes a reference signal generator 320, a fast droop detector 340, a DFLL control circuit 350, a digital frequency-locked loop (DFLL) 360, and a finite state machine (FSM) 370. In this implementation, the droop detection performed by fast droop detector 340 is used to control DFLL 360 to increase or decrease its output clock signal frequency.

Reference signal generator 320 has an input connected to a local power controller and receiving a digital number indicating a reference voltage, and an output providing a modulated digital signal indicating the reference voltage. The reference voltage is associated with the desired level of local supply voltage "VDD_CORE" to be monitored. Fast droop detector 340 has an input connected to the output of reference signal generator 320, an input receiving the VDD_CORE supply voltage, a third input, and an output.

DFLL control circuit 350 has an input connected to the output of fast droop detector 340, and an output connected to DFLL 360. DFLL 360 has a number of control and enable inputs (not shown) and an output providing a clock signal for synchronizing circuitry within a domain of the monitored supply voltage.

FSM 370 has an input connected to the output of fast droop detector 340, an output connected to the second input of fast droop detector 340, and may include a number of other control inputs (not shown).

In operation, the local power controller for the voltage domain of the monitored supply voltage, in this case VDD_CORE, is operable to adjust the monitored supply voltage and provide a new value for the binary number to reference signal generator 320 corresponding to the adjusted monitored supply voltage. Reference signal generator 320 provides a digitally modulated signal carrying the provided value. Fast droop detector 340 compares the VDD_CORE supply voltage to an analog signal based on the digitally modulated signal to detect droops in the VDD_CORE supply voltage. Based on detecting such a droop, fast droop detector 340 sends a droop detected signal to DFLL control circuit 350. Based on this signal, DFLL control circuit 350 commands DFLL 360 to slow the clock, or stop and then slow the clock, for a designated period.

Power supply monitor 302 includes a reference signal generator 320, a fast droop detector 340, a DFLL control circuit 350, a digital frequency-locked loop DFLL 360, a clock gate 380, and a finite state machine 370. In this implementation, the DFLL control scheme of FIG. 3B is used together with clock gate 380 to provide more rapid response to detected droops.

Reference signal generator 320 in FIG. 3B has an input connected to a local power controller and receiving a digital number indicating a reference voltage, and an output providing a modulated digital signal indicating the reference voltage. The reference voltage is associated with the desired level of local supply voltage "VDD_CORE" to be monitored. Fast droop detector 340 has an input connected to the output of reference signal generator 320, an input receiving the VDDCORE supply voltage, a second input, and an output.

DFLL control circuit 350 has an input connected to the output of fast droop detector 340, and an output connected to DFLL 360. DFLL 360 has a number of control and enable inputs (not shown) and an output providing a clock signal for synchronizing circuitry within a domain of the monitored supply voltage. Clock gate 380 has a first input connected to the output of DFLL 360, a second input connected to the output of fast droop detector 340, and an output for selectively providing the clock signal from DFLL 360.

FSM 370 has an input connected to the output of fast droop detector 340, an output connected to the second input of fast droop detector 340, and may include a number of other control inputs (not shown).

In operation of PSM 302, the local power controller for the voltage domain of the monitored supply voltage is operable to adjust the monitored supply voltage and provide a new value for the binary number to the reference signal generator corresponding to the adjusted monitored supply voltage. Reference signal generator 320 provides a digitally modulated signal carrying the provided value. Fast droop detector 340 compares the VDD_CORE supply voltage to an analog signal based on the digitally modulated signal to detect droops in the VDD_CORE supply voltage. Based on detecting such a droop, fast droop detector 340, sends a droop detected signal to clock gate 380 and DFLL control circuit 350. Based on this signal, clock gate 380 gates the clock to immediately gate the clock while DFLL control circuit 350 commands DFLL 360 to slow the clock for a designated period. Because DFLL 360 is relatively slow in responding to commands to implement a change in clock frequency, fast droop detector 340 is also responsive to the droop detection signal to control clock gate 380 to gate the clock signal for a designated period to reduce the power consumed by the circuit and mitigate the drooping voltage on the VDD_CORE supply. FSM 370 controls the designated period by resetting the clock gate control signal, such as by controlling a latch.

Figure 4:
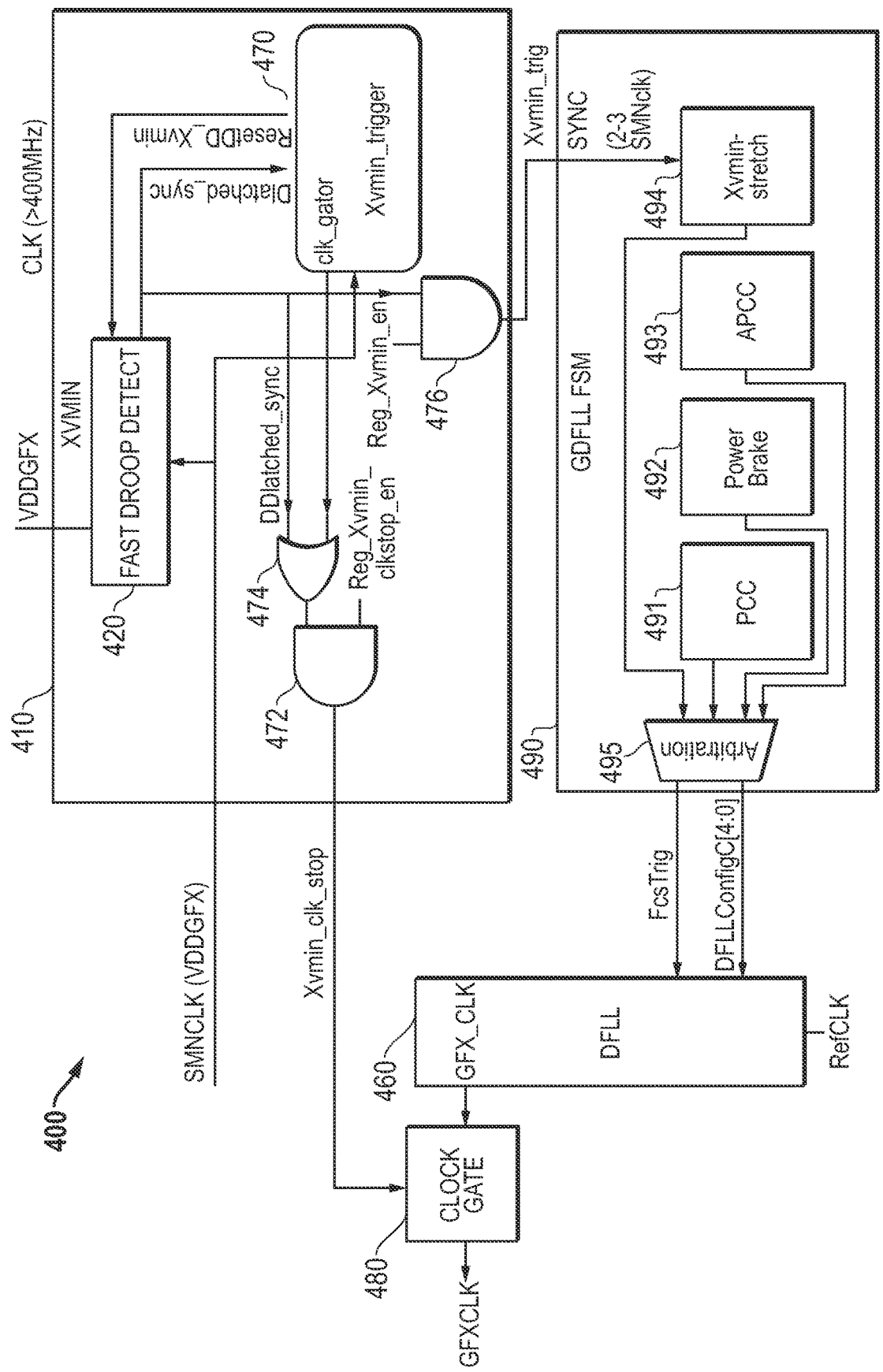
FIG. 4 shows in mixed block diagram and circuit diagram form a power supply monitor according to further additional implementations.

FIG. 4 shows in mixed block diagram and circuit diagram form a power supply monitor 400 according to further additional implementations. Power supply monitor 400 includes an extreme voltage minimum (XVMIN) detection circuit 410, a digital frequency-locked loop DFLL 460, a clock gate 480, and a graphics DFLL FSM 490 (GDFLL FSM). Power supply monitor 400 is an exemplary implementation of the power supply monitor of FIG. 3B, which provides more rapid response to detected droops. While the depicted implementation performs power supply monitoring for a graphics processor, power supply monitor 400 is suitable for use with a wide variety of integrated circuits (ICs) that need power supply monitoring, such as, for example, central processing units (CPUs) or other data processors and application-specific ICs (ASICs). These processors and the associated power supply monitor can be implemented in devices such as laptops, desktops, smartphones, tablets, servers, game consoles and a multitude of other devices incorporating processors and requiring power supplying monitoring.

XVMIN detection circuit 410 includes a first input receiving a graphics supply voltage labeled "VDDGFX" to be monitored, a second input receiving a system management network clock signal labelled "SMNCLK(VDDGFX)", a first output providing a signal labelled "Xvmin_trig", a second output labelled "Xvmin_clk_stop", a fast droop detector 420, an extreme voltage minimum trigger circuit 470 labelled "Xvmin_trigger", an AND gate 472, an OR gate 474, and an AND gate 476.

Figure 5:
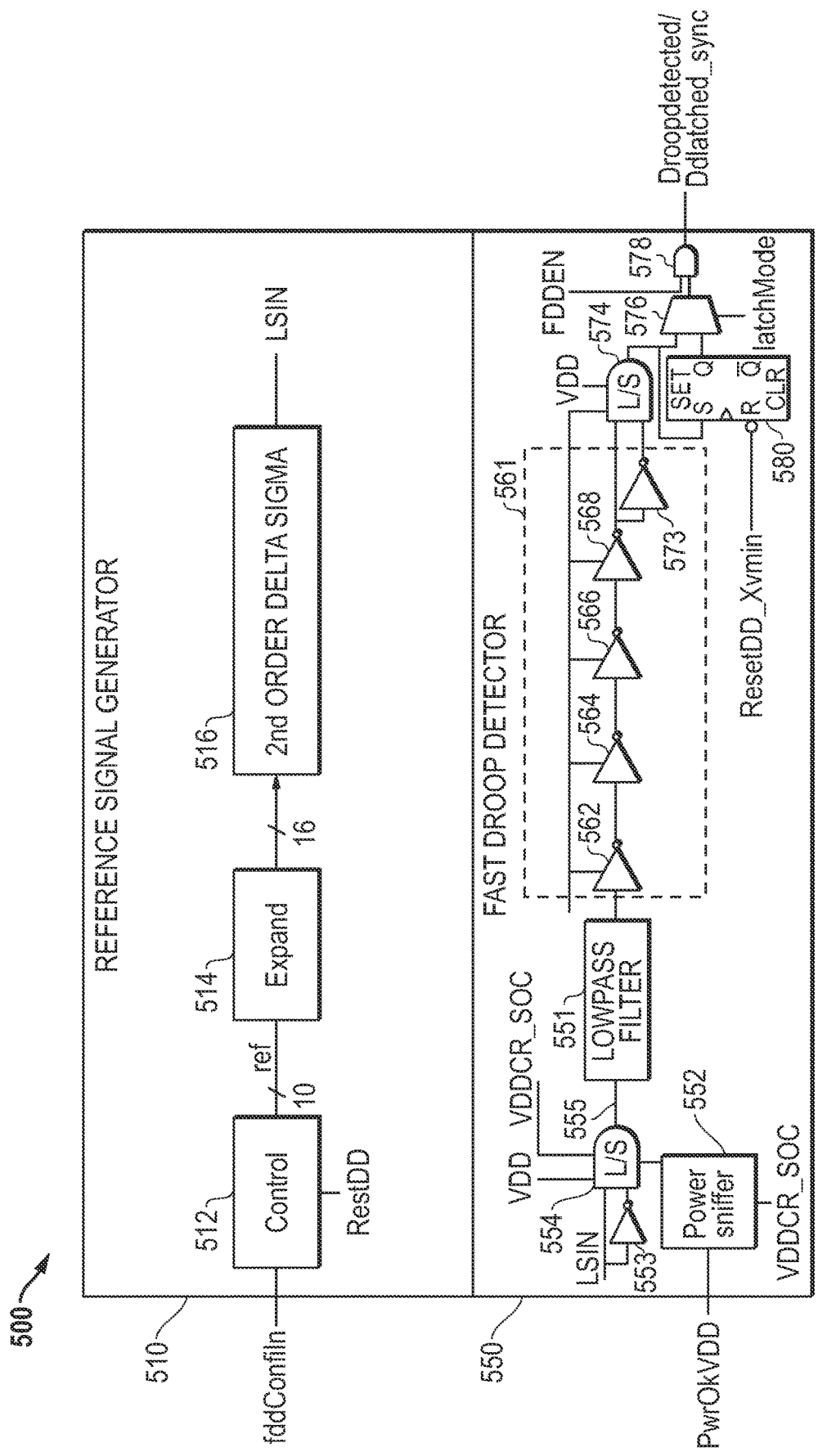
FIG. 5 shows in mixed block diagram and circuit diagram form a droop detection circuit according to further additional implementations, which are able to more quickly respond to voltage droops while employing a reduced area of silicon for the circuitry.

Fast droop detector 420, in this implementation, generally includes a reference signal generator that receives a digital value and produces a pulse-density modulated signal based on the digital value, and a droop detection circuit that converts the pulse-density modulated signal to an analog signal, compares the analog signal to a monitored supply voltage, and responsive to detecting a droop of the monitored supply voltage below a designated value relative to the analog signal, produces a droop detection signal. For example, FIG. 5 shows an implementation of a fast droop detector suitable for use as fast droop detector 420. Fast droop detector 420 has an input receiving the voltage VDDGFX to be monitored, an input receiving the clock signal SMNCLK(VDDGFX), an input receiving a signal labelled "ResetDD_Xvmin", and an output providing a signal labelled "DDlatched_sync".

Xvmin_trigger 470 is a control circuit, in this implementation of a FSM, and includes an input receiving the DDlatched_sync signal from fast droop detector 420, an output providing the ResetDD_Xvmin signal to fast droop detector 420, an input receiving the clock signal SMNCLK (VDDGFX), and an output providing a signal labelled "clk_gator".

OR gate 474 has a first input receiving the signal DDlatched_sync from fast droop detector 420, a second input receiving the signal clk_gator from Xvmin_trigger 470, and an output. AND gate 472 has a first input connected to the output of OR gate 474, a second input receiving a clock stop enable signal labelled "Reg_Xvmin_clkstop_en" from a configuration register (not shown), and an output providing a signal labelled "Xvmin_clk_stop".

AND gate 476 has a first input receiving the signal DDlatched_sync from fast droop detector 420, a second input receiving an enable signal labelled "Reg_Xvmin_en" from a configuration register (not shown), and an output providing the signal Xvmin_trig.

DFLL 460 has a first input receiving a clock signal labelled "RefCLK", a second input receiving signal labelled "DFLLConfigC[4:0]", a third input receiving a signal labelled "FcsTrig", and an output providing a clock signal for synchronizing circuitry within a domain of the monitored supply voltage VDDGFX, in this implementation a graphics processing core clock labelled "GFXCLK". Clock gate 480 has a first input receiving the clock signal GFXCLK from DFLL 460, a second input receiving the signal Xvmin_clk_stop from AND gate 472 of XVMIN detection circuit 410, and an output providing a gated version of clock signal GFXCLK.

GDFLL FSM 490 includes an input connected to receive the signal Xvmin_trig from XVMIN detection circuit 410, a frequency control stretch trigger output providing the signal FcsTrig, a second output providing the signal DFLLConfigC[4:0] containing a frequency control word (FCW) for DFLL 460, a control arbitration circuit 495 labelled "Arbitration", a peak current control (PCC) client stretch control circuit 491, a power brake client stretch control circuit 492 labelled "Power Brake", an adaptive PCC client stretch control circuit 493 labelled "APCC", and an XVMIN client stretch control circuit 494 labelled "Xvmin-stretch".

PCC client stretch control circuit 491 receives a signal (not shown) from the host IC's voltage regulator indicating whether an inductor current associated with the entire IC power supply is at risk of exceeding a maximum threshold. Based on this signal, PCC client stretch control circuit 491 produces an output indicating a requested amount of clock stretching (slowing), which is provided to control arbitration circuit 495 as a requested frequency control stretch (FCS) amount. Power brake client stretch control circuit 492 receives a signal (not shown) from a system state controller for throttling power consumption of a circuit based on workload, and produces an output provided to control arbitration circuit 495 indicating a requested FCS amount. APCC 493 has an input receiving a signal (not shown) from an adaptive peak current control circuit which is produced based on an amount of time a peak current control signal has been active. APCC 493 produces an output provided to control arbitration circuit 495 indicating a requested FCS amount. Xvmin-stretch 494 has an input receiving the signal Xvmin_trig, and an output connected to control arbitration circuit 495. Xvmin-stretch 494 produces an output signal to control arbitration circuit 495 indicating a requested FCS amount based on the amount of time the signal Xvmin_trig has been active.

Control arbitration circuit 495 has four inputs connected respectively to outputs of PCC 491, Power Brake 492, APCC 493, and Xvmin-stretch 494 also have respective inputs (not shown) for receiving signals related to their functions. Control arbitration circuit 495 generally functions to select which stretch client of the four connected stretch clients will control the amount of clock stretch required of DFLL 460, as further described below.

In operation, fast droop detector 420 of FIG. 4 monitors the supply voltage VDDGFX and will assert an internal signal "Droopdetected" if voltage crosses certain predefined threshold level. This internal signal, in normal operation, is latched at the output of fast droop detector 420 and is shown as the signal DDlatched_sync. Xvmin_Trig state-machine receives the signal DDlatched_sync as input and initiates gating of clock signal GFXCLK through the signal Xvmin_clk_stop. As the frequency of this clock drops to no-clock, the current drawn from supply voltage VDDGFX is reduced, causing the VDDGFX rail voltage to come out of droop. The signal internal Droopdetected that triggers this sequence is latched signal such that it stays high (irrespective of the voltage of VDDGFX) unless it gets reset by the ResetDD_Xvmin signal from Xvmin_trig 470. This Droopdetected signal will also go out to GDFLL FSM 490 as a trigger signal (Xvmin_Trig).

GDFLL FSM 490 has different clients 491, 492, 493, and 494 requesting different amounts of stretch for different programmable durations. While these particular clients are shown, other clients employed in performance control and power control may be employed, and, of course, fewer clients may be used in various implementations. Xvmin-stretch 494 is one of the clients requesting stretch and is triggered by the signal Xvmin_Trig. In response, Xvmin_stretch 494 initiates a sequence of states to control how the clock frequency increased back to its earlier state. This sequence is performed through a force-stretch mode of the DFLL 460 in which a frequency control word that controls the DCO clock frequency in DFLL 460 is gradually increased to its initial operating state. Typically, when the power delivery network (PDN) providing supply voltage VDDGFX responds to a large current change event (known as a di/dt event), like the extreme stretch produced by the trigger described above, the supply voltage tends to oscillate between droops and overshoot for few cycles at PDN resonance frequencies before eventually getting dampened out. By increasing the clock frequency in this gradual manner, the depicted circuit ensures that frequency of power supply voltage changes is much lower than the natural resonance frequency of the PDN and prevent further oscillations. Different clients can request different stretch amount at different times, and control arbitration circuit 495 arbitrates among all these requests. Preferably, the client requesting the largest stretch amount will get the precedence and control DFLL 460.

Referring in more detail to the triggering process, in this implementation, the logic of GDFLL FSM 490 runs on the clock signal SMNCLK, which as shown is over 400 Mhz, rather than a system reference clock which is typically a lower speed of around 100 Mhz, to reduce latency for initiating stretching events. Xvmin_trigger 470 will be triggered as soon as the signal DDlatched_sync toggles high. For an extreme voltage minimum event, the goal of power supply monitor 400 is to drop the frequency of clock signal GFXCLK as fast as possible and stretch as deeply as allowed. However, any update of the FCW to DFLL 460 to change clock frequency will need to go through GDFLL FSM 490, and the arbitration therein requires several clock cycles. So instead, Xvmin_trigger 470 generates the signal Xvmin_clock_gator that goes to clock gate 480. However, even this fast path will take 2-3 cycles of the SMNCLK (VDDGFX) clock on which the power supply monitor 400 operates to synchronize following a droop event. To avoid this additional delay, the signal DDlatched_sync is OR-ed with clock_gator signal generated by Xvmin_Trig 470 to control clock gate 480. DDlatched_sync will stay high once triggered, and therefore it should be free of glitches. Furthermore, clock gate 480 will internally synchronize its input (over 2-3 GFXCLK cycles and GFXCLK runs at a relatively high frequency), so that no glitch can pass through. In this way, within a delay of 2-3 GFXCLK cycles (plus the logic and propagation delay) following a droop event, GFXCLK will be stopped.

In a preferred implementation, Xvmin_trigger 470 will first reset the latch of fast droop detector 420 with the ResetDD_Xvmin signal (FIG. 6), causing the signal DDlatched_sync signal to go low after a programmable count, and then release clock gating after an additional programmable cycle count. This sequence ensures that the following restrictions are followed. First, DDlatched_sync will stay high and stable long enough to get synchronized properly and initiate Xvmin-stretch 494 inside GDFLL FSM 490. Second, by resetting DDlatched_sync before releasing clock gating, the circuit ensures that if there is a new droop event (when GFXCLK is restored suddenly), mafdd is ready to react.

Programmability for the signal Xvmin_clock_stop ensures that the circuit can stop the clock at least for a few cycles more than what it takes to propagate the FCS stretch amount through GDFLL FSM 490 (including arbitration and synchronization) and finally to DFLL 460 to update its FCW and change to stretched clock frequency.

Because DFLL 460 supports external triggers to stretch the output CLK, different parts of the host system may use this stretching trigger to implement different features that are making use of DFLL stretch functionality. One of these different features is the peak Current Control (PCC) feature that limits the amount of current that the VDDGFX domain consumes for protection of an off-chip voltage regulator. A similar functionality exists regarding the power brake (PB) feature for throttling performance. The amount of stretch for these two features is the same and is programmable between 3% to 97.5% of the clock speed. GDFLL FSM 490 supports hysteresis counters for both inputs that can be used to filter the stretch input and make the stretch last longer.

Adaptive PCC (or APCC) is a feature that dynamically changes the stretch amount according to how long the PCC signal has been asserted. The longer the PCC assertion, the higher the stretch amount is. Upon de-assertion of the PCC input, the stretch amount is decreased rather than abruptly being switched to zero. To implement this feature, APCC 493 is a programmable state machine within the GDFLL block to control the initial stretch, incremental stretch, max stretch, decremental stretch, final stretch and the time for each step.

In prior clock stretch arbitration schemes, triggers from different features were OR-ed, i.e. a trigger from any feature will program DFLL stretch amount similarly. Since XVMIN 410 is there to protect any voltage excursion beyond a designated minimum voltage "Vmin", Xvmin-stretch 494 will request a stretch amount more than other force stretch events. However, when XVMIN 410 is coming out of deep stretch, GDFLL FSM 490 will need to compare its own FCS request against other FCS requests from the other clients, and whichever client demands max stretch will be treated as the final FCWoffset. This will ensure that all clients get the protection they need. This arbitration process is implemented inside GDFLL FSM.

Upon assertion of Xvmin_Trig, Xvmin-stretch 494 will generate the max FCS stretch amount. This stretch amount is preferably programmable. Upon de-assertion of the Xvmin_Trig input, the stretch amount will gradually decrease rather than abruptly being switched to zero. It will make use of a programmable state machine within the GDFLL block to control the initial stretch, incremental stretch, max stretch, decremental stretch, final stretch and the time for each step. All mentioned settings are preferably programmable and controlled through a register interface.

FIG. 5 shows in mixed block diagram and circuit diagram form a portion of a power supply monitor 500 according to further additional implementations. The depicted portion of a power supply monitor 500 is suitable for use with the monitoring and control topologies shown in FIG. 3, FIG. 4, and FIG. 5, as well as other circuits in which a power supply is monitored to detect fast droops of the power supply voltage. For example, the design of power supply monitor 500 is employed in some implementations to control a charge injection system such as the prior art system shown in FIG. 1 and FIG. 2. Power supply monitor 500 generally includes a reference signal generator 510 and a fast droop detector circuit 550.

In this implementation, reference signal generator 510 has input labeled "fddConfigIn" receiving a binary number and an output labeled "LSIN" providing a pulse-density modulated signal. Generally, reference signal generator 510 operates to scale the pulse-density modulated signal based on the binary number. Reference signal generator 510 includes a control circuit 512, an expander 514, and a second order delta sigma modulator 516. Control circuit 512 has a first input receiving a 10-bit binary number carried on the fddConfigIn input, a second input receiving a reset signal labelled "resetDD", and an output labelled "ref" carrying the 10-bit binary number. Control circuit 512 generally operates to halt the passage of the 10-bit binary number when the resetDD indicates fast droop detector circuit 550 is disabled or reset, and pass the 10-bit binary number to the its output when the fast droop detector is operational. Expander 514 has an input connected to the output of control circuit 512 and an output. Expander 514 expands the 10-bit number to a 16-bit number.

In this implementation, delta-sigma modulator 516 is a second-order delta-sigma modulator having an input connected to the output of expander 514 and an output providing a pulse-density modulated binary signal LSIN. While delta-sigma modulation is used in this implementation, other suitable modulation schemes may be employed to provide the pulse density modulated signal based on the binary number, which represents a desired voltage level for the monitored power supply.

Reference signal generator 510 generates a bitstream whose average value (ideally) equals a supply voltage VDD on which reference signal generator 510 operates, scaled by the 10-bit binary number received as a reference at the fddConfigIn input. The long-term average output voltage of the bitstream LSIN will correspond to Equation 1 below, with "ref_value" being the value of the 10-bit number supplied the fddConfigIn input:

$$<LSIN>avg=ref\_value*VDD \qquad (1)$$

While this particular modulator design is employed in this implementation, other implementations employ other suitable delta-sigma modulator designs, or other types of modulators for producing a pulse-density modulated signal. The pulse-density modulated signal LSIN is fed to the input of fast droop detector circuit 550.

Fast droop detector circuit 550 includes a power sniffer 552, a level shifter 554, a lowpass filter 551, a comparator 561, a second level shifter 574, a latch 580, a two-to-one multiplexor 576, and an AND gate 578. Fast droop detector circuit 550 is suitable for use in the power supply monitor circuits of FIG. 3, FIG. 4, and FIG. 5, as well as other power supply monitor circuits.

Level shifter 554 has a first input receiving the pulse-density modulated signal LSIN, a second input receiving an enable signal from power sniffer 552, and an output providing the pulse-density modulated signal referenced to a clean supply voltage labeled "VDDCR SOC" at the node labelled 555 (the voltage on this node is referred to as "voltage 555"). Level shifter 554 may also include an inverting input 553 to provide an inverter version of signal LSIN for use in level shifting. Level shifter 554 is supplied with two voltages for the two domains across which it shifts voltage levels, from VDD to VDDCR_SOC.

Power sniffer 552 has a first input receiving a power indication signal labeled "PwrOkVDD", a second input receiving the clean supply voltage VDDCR_SOC, and an output connected to level shifter 554. Power sniffer 552 enables level shifter 554 responsive to its two inputs when VDD is in a designated range.

Lowpass filter 551 has an input coupled to the output of level shifter 254 and an output. Many lowpass filter designs and component values are suitable for use in various implementations.

Comparator 561 has a first input coupled to the output of lowpass filter 551, a second input receiving a monitored supply voltage VDDCORE, and an output. Generally, comparator 561 provides a droop detection signal at its output responsive to the monitored supply voltage VDDCORE dropping below a predetermined level relative to the first input. In this implementation, comparator 561 comprises a series of four inverters including a first complimentary-metal-oxide-semiconductor (CMOS) inverter 562, a second CMOS inverter 564, a third CMOS inverter 566, and a fourth CMOS inverter 568. Each inverter 562, 564, 566, and 568 includes a positive supply terminal connected to the second input of the comparator to provide VDDCORE as the supply voltage for the inverters. CMOS inverter 562 has an input connected to first input of the comparator, and inverters 564, 566, and 568 are connected in series following inverter 562. The output of inverter 568 provides a droop detection signal to level shifter 574.

In this implementation, inverters 562, 564, 566, and 568 are biased such that they are configured to operate in a "crowbar" mode or crowbar region of operation in which both the p-type metal-oxide semiconductor (PMOS) and n-type metal-oxide semiconductor (NMOS) sides of the inverter are turned on when the monitored supply voltage is at approximately the predetermined level relative to the voltage on the respective inverter input. In this implementation, the predetermined level is twice the level of the voltage at the inverter input. Thus, as one-half of VDDCORE drops to the voltage at the output of lowpass filter 551, the inverters 562, 564, 566, and 568 enter crowbar mode and switch from a digital low to a digital high to signal a droop. Such operation provides a high gain and fast response for detecting droops below a designated level relative to the threshold voltage provided at the input of inverter 562. Since the inverters are biased in a crowbar-state, they are highly sensitive to any noise on the input VDD rail. In some implementations, at least inverter 562, or inverters 562 and 564, are biased in such a crowbar state.

Level shifter 574 has an input connected to the output of comparator 561, and an output. Level shifter 574 is supplied with both the VDDCORE supply voltage (the monitored voltage), and the VDD supply voltage. Level shifter 574 may also include an inverting input 573 to provide an inverter version of the droop comparator output for use in level shifting. Level shifter 574 operates to shift the droop detection signal to be referenced to the VDD voltage.

Multiplexor 576 has a first input connected to the output of level shifter 574 for receiving the droop detection signal, a second input, a selector input labeled "latchMode", and an output coupled to the clock gate (i.e., 360, FIG. 3, 560, FIG. 5) for gating a clock signal responsive to the droop detection signal.

Latch 580 is a set-reset (SR) flip flop having an "S" input connected to the output of level shifter 574, an "R" input receiving a reset signal labeled "resetDD_X", a "Q" output connected to the second input of multiplexor 576, and a "Q-NOT" output which is unused in this implementation. The latchMode input of multiplexor 576 is used to select whether the between the two inputs.

AND gate 578 has a first input receiving an enable signal for the droop detection circuit labeled "FDDEN", a second input receiving the droop detection signal from the output of multiplexor 576, and an output providing the final output of fast droop detector circuit 550 labelled "droopDetected".

In operation, fast droop detector circuit 550 receives the LSIN pulse-density modulated signal. Due to the variability on VDD, this signal needs to be translated into a fixed voltage, which is accomplished through level shifter 554 supplied from VDDCR_SOC. This VDDCR_SOC voltage is a stable, regulated voltage providing a fixed amplitude for the level-shifted pulse-density modulated output of level shifter 554. The new, fixed amplitude signal feeds lowpass filter 551, which averages the value of the pulse-density modulated signal to produce a stable analog voltage to use with comparator 561. This stable analog value provides a threshold, for detecting droops in the VDDCORE voltage supply. In this implementation, the threshold ("fdd threshold", FIG. 7) is twice the voltage of the stable analog value. Lowpass filter 551 is a double RC low pass filter operating with a cut-off frequency under 10 MHz.

The output of low pass filter 561 feeds the series of inverters in comparator 561 supplied from VDDCORE that acts as an analog comparator. Because they are biased in the "crowbar" region, the series of inverters responds quickly to droops below the designated threshold. Preferably at least two inverters are used to provide stability for the droop detected signal, and more preferably at least three or four (as shown). The droop detected signal at the output of comparator 561 is level shifted back to VDD domain to be used for controlling various circuits to mitigate power supply droop, such as the clock gate and PLL circuits depicted in FIG. 3, FIG. 4, and FIG. 5. Latch 580 is included to hold the droop detected signal at a digital HIGH for a designated period to provide proper timing for control of operations such as a one-time charge injection operation or a PLL adjustment. When latch 580 is enabled, the droop detected signal remains on once is triggered until is actively turned off by the local FSM.

Figure 6:
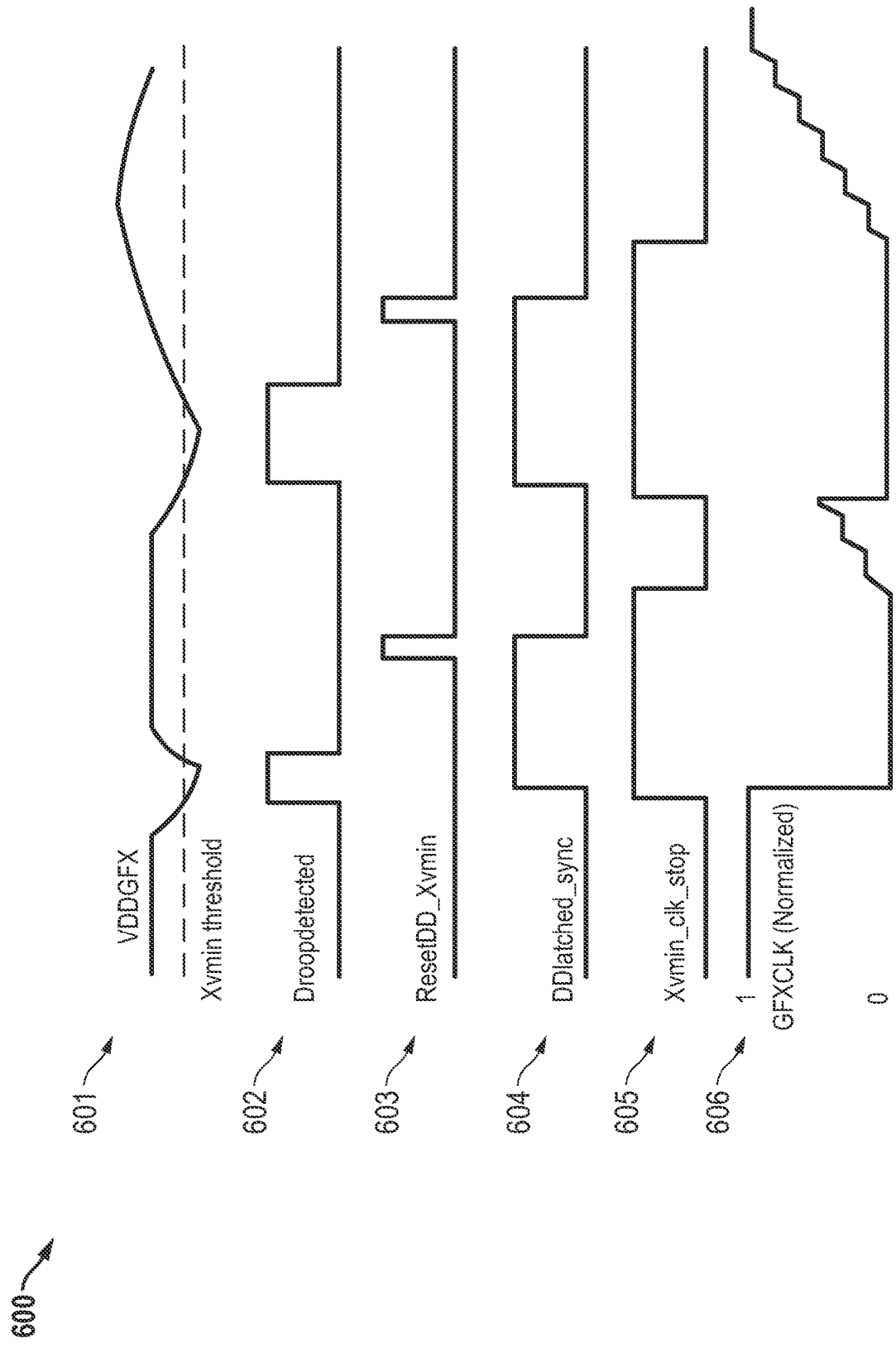
FIG. 6 shows a graph depicting respective signals associated with power supply monitor circuit of FIG. 4.

FIG. 6 shows a graph 600 depicting respective signals associated with power supply monitor circuit 400 of FIG. 4. The signals 601, 602, 603, and 604, and 605 show the digital level of the signal over time as two droops are detected in the monitored supply voltage VDDGFX, while signal 606 illustrates the normalized speed of the DFLL output clock GFXCLK. The depicted signals are aligned with respect to time.

For signal 601, the monitored supply voltage VDDCORE is shown relative to the Xvmin threshold on which fast droop detector 420 detects droops. VDDCORE droops below the threshold twice in the depicted scenario. Fast droop detector 420 detects the droop and produces the "Droopdetected" signal shown in graph 602. XVmin_FSM 440 provides the signal "ResetDD_Xvmin" in graph 603, which controls the latch holding the Droopdetected signal to reset it after a droop is detected.

Signal 604 is the latched droop detected signal, DDlatched_sync, which is activated goes HIGH when the droop detected signal activates the latch output, and is held HIGH until it is reset. XVmin_FSM 440 has a programmable period which can be adjusted depending on the use of the DDlatched_sync signal. Signal 605 shows the signal Xvmin_clk_stop, which in the implementation of FIG. 4 is produced by XVMIN detection circuit 410 to control clock gate 480. Signal 606 shows the normalized clock speed of DFLL 460 relative to its highest operating speed before a droop detection event. As can be seen in the graph, the DDlatched_sync signal initially causes clock gate 408 to gate the clock, down to a no-clock or zero normalized level. Then as control arbitration circuit 495 responds to its inputs to start controlling the frequency of DFLL 460, following three cycles of the RefClk, it causes DFLL 460 to gradually ramp up the speed of GFXCLK. Because in the depicted scenario, the second droop is detected before GFXCLK reaches its full normalized value, GFXCLK is again gated and then ramp up process is completed.

Figure 7:
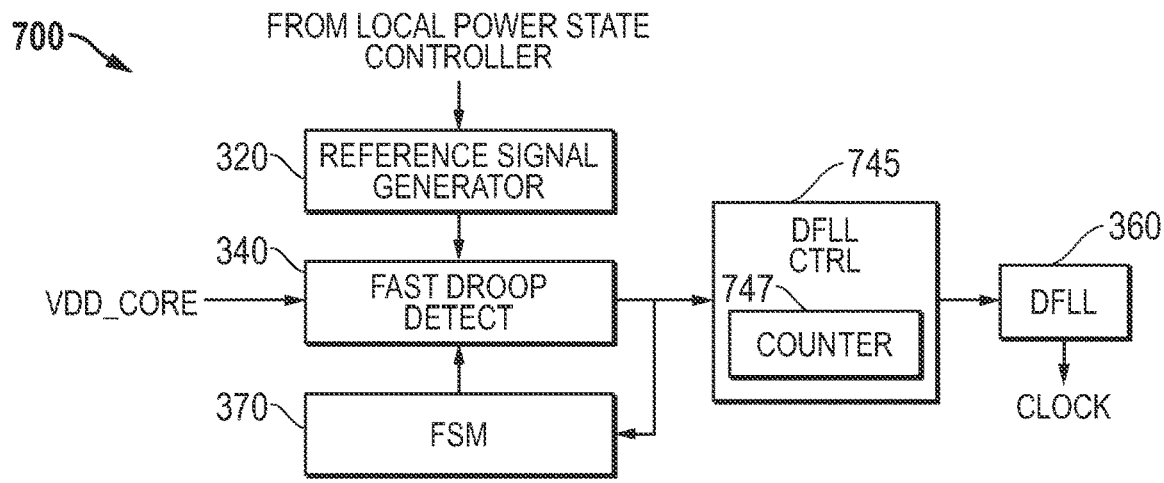
FIG. 7 illustrates a block diagram of a power supply monitor according to some additional implementations.

FIG. 7 illustrates a block diagram of a power supply monitor 700 according to some additional implementations additional features for mitigating potential electrical design current (EDC) event. Power supply monitor 700 includes a reference signal generator 320, a fast droop detector 340, a digital frequency-locked loop (DFLL) 360, a DFLL control circuit 745, and a finite state machine 370. Similarly to that of FIG. 3A, fast droop detector 340 performs droop detection which is used to control DFLL 360 to increase or decrease its output clock signal frequency. FSM 370 also functions similarly to that of FIG. 3A.

In this implementation, DFLL control circuit 745 includes additional features for mitigating potential EDC events that may violate a peak current constraint of the power supply related to the socket over which power is supplied to the host IC, for example. Traditionally, EDC events are managed by PCC signals such as that provided to PCC client stretch control circuit 491 (FIG. 4). Typically, such EDC events are not instantaneous and develop over a period of time such as 500 nanoseconds or 1 microsecond. However, because the PCC signals are typically generated off of the host IC, they take a relatively large amount of time to reach internal circuits to the IC to be used for throttling and power control functions. Power supply monitor 700 provides an alternative way to measure such events that occurs on-chip and therefore is able to respond more quickly to potential EDC events, and more effectively prevent them.

DFLL control circuit 745 has an input connected to the output of fast droop detector 340, an output connected to DFLL 360, various digital control logic (not shown) which may be implemented as described above, and a counter 747. The counter value increments while a droop is detected and decrements toward a zero value while a droop is not detected. Responsive to the counter value exceeding a designated threshold, DFLL control circuit 745 provides a signal indicating a potential EDC event exists that may violate the peak current constraint.

Figure 8:
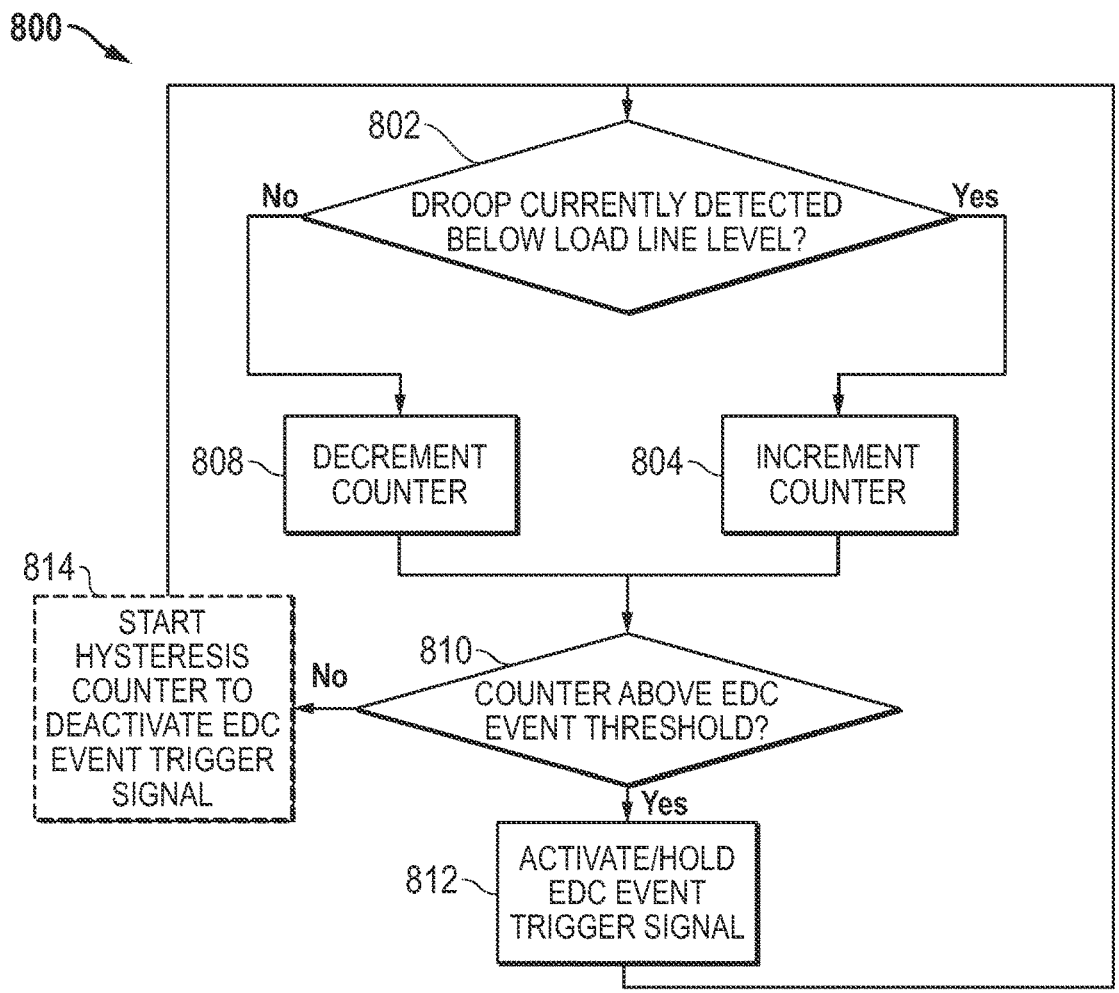

FIG. 8 shows a flow diagram 800 showing the operation of an electrical design current mitigation process according to some implementations. The depicted process is suitable for use with power supply monitor 700 of FIG. 7, or other power supply monitor circuits.

The process starts at block 802, where it determines if a droop is detected below a defined load line level. The process then runs continuously. If a droop is detected at block 802, the process goes to block 804 where it increments a counter such as counter 747. If a droop is not detected, the process goes to block 808, where it decrements the counter. (If the counter is already at zero, no action is taken.)

At block 810, if the counter is above a predetermined threshold for detecting a potential EDC event, the process goes to block 812 where it activates, or holds, an EDC event trigger signal. Such a signal may be used in various places on the host IC for triggering responses to potential EDC events. For example, the process may provide a signal to a stretch client such as those described with respect to FIG. 4, thus activating stretches of a DFLL through an arbitration process including other clients. At block 810, if the counter is not above the EDC event threshold, the process starts a separate hysteresis counter to deactivate the EDC event trigger signal. The hysteresis counter is reset when the EDC threshold is passed again if the other is above the threshold at block 810. When the hysteresis counter reaches a designated value without being reset, the EDC event trigger signal from block 812 is deactivated. The process is continuous in response to droops being detected or not detected as shown by the arrows returning to block 802.

Figure 9:
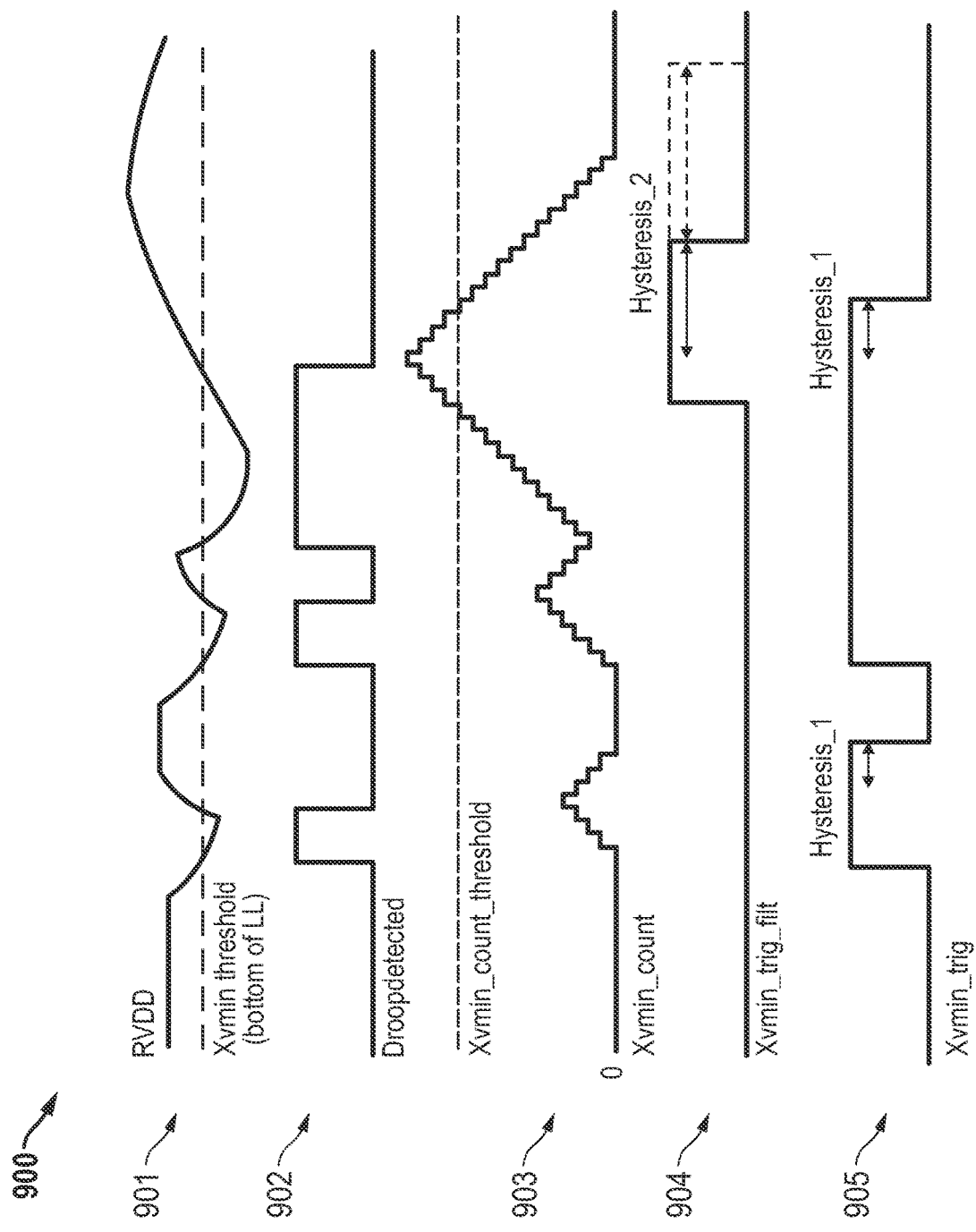
FIG. 9 is a graph of several signals depicting respective signals associated with power supply monitor circuit of FIG. 7.

FIG. 9 shows a graph 900 depicting respective signals associated with power supply monitor circuit 700 of FIG. 7. The signals 901, 902, 903, and 904, and 905 depict the operation over time as three droops are detected in the monitored supply voltage VDDCORE. The depicted signals are aligned with respect to time.

In signal 901, the monitored supply voltage, in this example labeled "RVDD", is shown relative to the Xvmin threshold on which fast droop detector 420 detects droops. In this implementation, the Xvmin threshold is set relative to the bottom of a Load Line (LL) region to enable detecting potential EDC events. RVDD droops below the threshold twice in the depicted scenario. Fast droop detector 420 detects the droop and produces the "Droopdetected" signal shown in graph 902.

In signal 903, the value of a counter such as counter 747 (FIG. 7) increments whenever the Droopdetected signal is active. The unlatched droop detected signal as described with respect to FIG. 5 is employed for this functionality to provide an accurate value for the counter. The counter decrements responsive to the droop no longer being detected. After the second depicted droop in signal 901, a third droop begins before the counter is completely decremented, causing it to increment again. This droop lasts long enough to cause the counter to exceed a designated threshold labelled "Xvmin_count_threshold".

Signal 904 shows EDC event trigger signal "Xvmin_trig_filt" generated at block 812 in the process of FIG. 8 to indicate an EDC event. Signal Xvmin_trig shows a programmable delay "Hysteresis_2" provided by DFLL control circuit 745 (FIG. 7), as shown at block 814 of FIG. 8, to control the period for which the signal Xvmin_trig_filt is held HIGH after being triggered. Signal 905 shows a signal "Xvmin_trig", which functions similarly to the signal DDlatched_sync shown in FIG. 6, to provide a latched version of the Droopdetected signal for stabilizing the function of the droop detection circuit. Signal Xvmin_trig shows a programmable delay "Hysteresis_1" provided by FSM 370 (FIG. 7) to control the latch of fast droop detect circuit 340 in this implementation. As can be seen comparing signals 904 and 905, the process of using a counter acts a filter to Xvmin_trig events, such that only events that persist for a designated number of clock cycles cause potential EDC events to be recognized and the trigger, Xvmin_trig_filt, to the activated.

Figure 10:
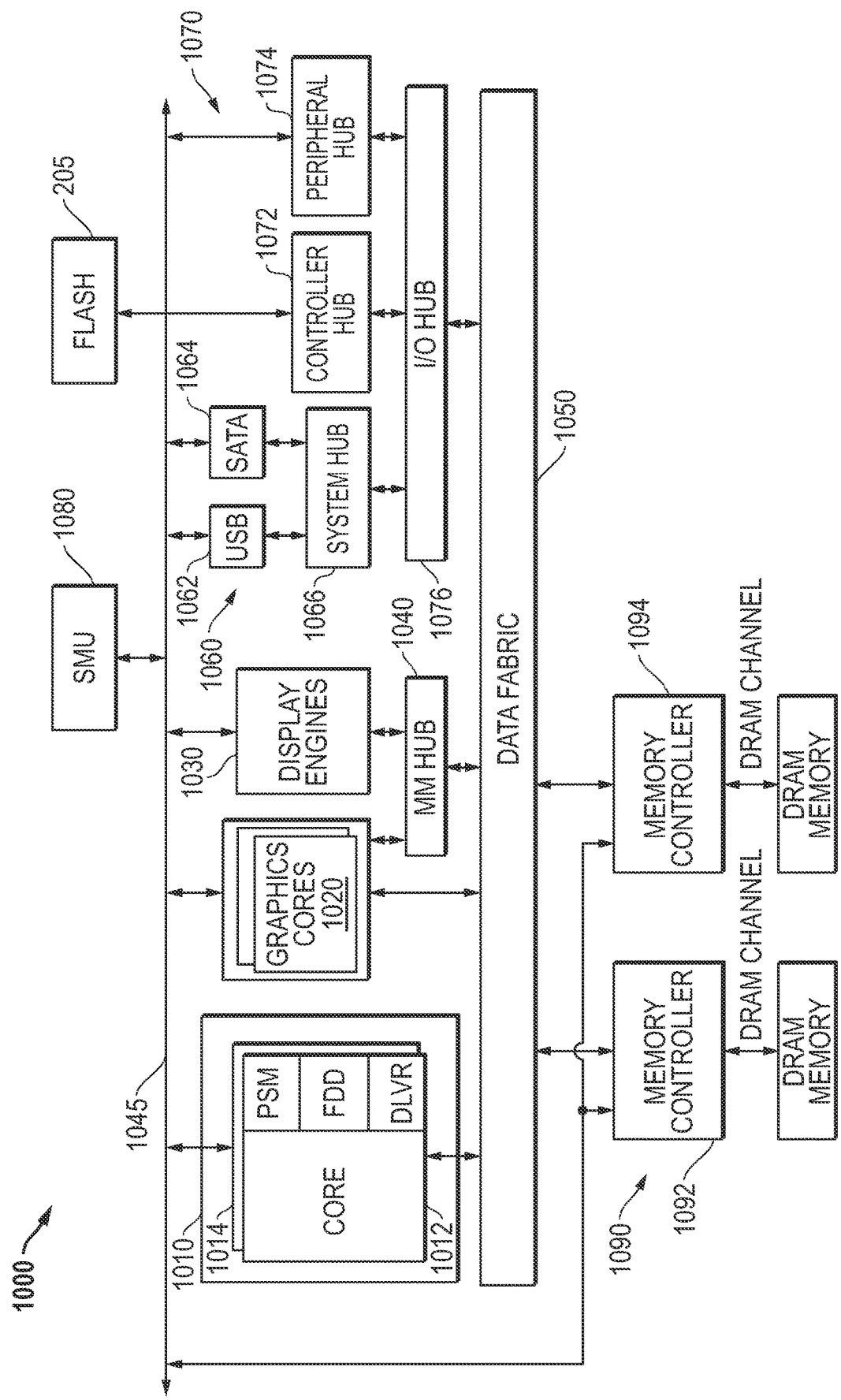
FIG. 10 illustrates in block diagram form an accelerated processing unit (APU) according to some implementations.

FIG. 10 illustrates in block diagram form an accelerated processing unit (APU) 1000 according to some implementations. APU 1000 is implemented as a System-on-Chip (SoC) which may be part of a variety of host data processing platforms in various implementations. While an APU is shown in this implementation, other data processing platforms such as a central processing unit (CPU) or a graphics processing unit (GPU) may be used. For example, in some implementations, the fine-grained memory access techniques herein are embodied in a GPU chip employed in a graphics card or other graphics processing module. In other implementations, specialized processor cores such as intelligence processing units (IPUs) may be employed. In this implementation, APU 1000 includes generally a CPU core complex 1010, a graphics core 1020, a set of display engines 1030, a memory management hub 1040, a data fabric 1050, a set of peripheral controllers 1060, a set of peripheral bus controllers 1070, a system management unit (SMU) 1080, a flash memory 205, and a set of FG_DRAM memory controllers 1090.

CPU core complex 1010 includes a processor tile 1012 and a processor tile 1014, each processor tile including a CPU core, a power supply monitor (PSM), a fast droop detector (FDD), and a digital low voltage regulator (DLVR). In this example, CPU core complex 1010 includes two processor tiles, but in other implementations processor tile complex 1010 can include an arbitrary number of processor tiles. Each of processor tiles 1012 and 1014 is bidirectionally connected to a system management network (SMN) 1045, which forms a control fabric, and to data fabric 1050, and is capable of providing memory access requests to data fabric 1050. Each of processor tiles 1012 and 1014 may be unitary cores, or may further be a core complex with two or more unitary cores sharing certain resources such as caches. The FDD implementations of FIGS. 3-5 and 7 are all suitable for use in processor tiles 1012 and 1014 in various implementations. Each FDD controls a local PLL or DFLL for its local CPU core according to the techniques described above.

Each of graphics cores 1020 is a high-performance graphics processing unit (GPU) capable of performing graphics operations such as vertex processing, fragment processing, shading, texture blending, and the like in a highly integrated and parallel fashion. Power supply monitoring with an FDD such as those of FIGS. 3-5 and 7 may also be implemented in each of graphics cores 1020 in various implementations. Each graphics core 1020 is bidirectionally connected to the SMN 1045 and to data fabric 1050, and is capable of providing memory access requests to data fabric 1050. In this regard, APU 1000 may either support a unified memory architecture in which CPU core complex 1010 and graphics cores 1020 share the same memory space, or a memory architecture in which CPU core complex 1010 and graphics cores 1020 share a portion of the memory space, while graphics cores 1020 also uses a private graphics memory not accessible by CPU core complex 1010.

Display engines 1030 render and rasterize objects generated by graphics core 1020 for display on a monitor. Graphics core 1020 and display engines 1030 are bidirectionally connected to a common memory management hub 1040 for uniform translation into appropriate addresses in memory, and memory management hub 1040 is bidirectionally connected to data fabric 1050 for generating such memory accesses and receiving read data returned from the memory system.

Data fabric 1050 includes a crossbar switch for routing memory access requests and memory responses between any memory accessing agent and memory controllers 1090. It also includes a system memory map, defined by basic input/output system (BIOS), for determining destinations of memory accesses based on the system configuration, as well as buffers for each virtual connection.

Peripheral controllers 1060 include a USB controller 1062 and a serial advanced technology attachment (SATA) interface controller 1064, each of which is bidirectionally connected to a system hub 1066 and to SMN 1045. These two controllers are merely exemplary of peripheral controllers that may be used in APU 1000.

Peripheral bus controllers 1070 include a system controller hub 1072 and a peripheral controller hub 1074, each of which is bidirectionally connected to an input/output (I/O) hub 1076 and to SMN 1045. System controller hub 1072 connects to Flash memory 205 over a suitable communications link. I/O hub 1076 is also bidirectionally connected to system hub 1066 and to data fabric 1050. Thus, for example, a CPU core can program registers in USB controller 1062, SATA interface controller 1064, system controller hub 1072, or peripheral controller hub 1074 through accesses that data fabric 1050 routes through I/O hub 1076.

SMU 1080 is a local controller that controls the operation of the resources on APU 1000 and synchronizes communication among them. SMU 1080 manages power-up sequencing of the various processors on APU 1000 and controls multiple off-chip devices via reset, enable and other signals. SMU 1080 also manages power for the various processors and other functional blocks.

While a SoC implementation is shown, this is not limiting, and other computing platforms may also benefit from the techniques set forth herein.

The circuits of FIG. 3A, FIG. 3B, FIG. 4, FIG. 5, FIG. 7, and FIG. 10 or any portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular implementations have been described, various modifications to these implementations will be apparent to those skilled in the art. Accordingly, it is intended by the appended claims to cover all modifications of the disclosed implementations that fall within the scope of the disclosed implementations.

What is claimed is:

1. An apparatus comprising:
   a reference signal generator that receives a digital value and produces a pulse-density modulated signal based on the digital value;
   a droop detection circuit that converts the pulse-density modulated signal to an analog signal, compares the analog signal to a monitored supply voltage, and responsive to detecting a droop of the monitored supply voltage below a designated value relative to the analog signal, produces a droop detection signal;

a digital frequency-locked loop (DFLL) providing a clock signal for synchronizing circuitry within a domain of the monitored supply voltage; and a DFLL control circuit that, responsive to receiving the droop detection signal, causes the DFLL to slow the clock signal.

2. The apparatus of claim 1, further comprising:
a clock gate coupled to the DFLL for gating the clock signal; and
a latch with an input receiving the droop detection signal and an output coupled to the clock gate for gating the clock signal responsive to the droop detection signal.

3. The apparatus of claim 2, further comprising a state machine having an input receiving the droop detection signal, and an output coupled to control the latch, wherein the state machine controls the latch to hold the droop detection signal for a designated period of time following the droop detection circuit no longer detecting the droop, and reset the droop detection signal following the designated period of time.

4. The apparatus of claim 1, wherein the DFLL control circuit comprises:
a first input receiving the droop detection signal;
one or more additional inputs each receiving a clock stretch request signal from a respective additional circuit in an integrated circuit; and
arbitration logic for selecting which of the droop detection signal and the one or more additional inputs shall determine how much to slow the DFLL.

5. The apparatus of claim 1, wherein the DFLL control circuit is further operable to set a DFLL increment amount at the DFLL for controlling how quickly the DFLL increases a speed of the clock signal after the clock signal is slowed.

6. The apparatus of claim 1, wherein the droop detection circuit includes a level shifter for converting the pulse-density modulated signal to be referenced to a clean supply voltage.

7. The apparatus of claim 1, wherein the droop detection circuit includes a comparator comprising a series of inverters including at least a first complimentary-metal-oxide-semiconductor (CMOS) inverter and a second CMOS inverter each including a positive supply terminal receiving the monitored supply voltage, the first CMOS inverter including an input receiving the analog signal, the first CMOS inverter configured to operate in a crowbar mode when the monitored supply voltage is near a designated level.

8. The apparatus of claim 1, further comprising:
a counter receiving the droop detection signal from the comparator, the counter including a counter value that increments while the droop detection signal indicates a droop is detected and decrements while the droop detection signal indicates a droop is not detected; and
a control circuit comparing the counter value to a threshold and responsive to the counter value exceeding the threshold, providing a signal indicating a potential electrical design current (EDC) event exists that may violate a peak current constraint.

9. The apparatus of claim 1, wherein the apparatus is a processor.

10. The apparatus of claim 1, wherein the apparatus further comprises a device that is one of a laptop computer, a desktop computer, a smartphone, a tablet computer, a server, a game console, and a multimedia device.

11. A method of monitoring a power supply, the method comprising:
receiving a digital number;
creating a pulse-density modulated signal scaled based on the digital number;
converting the pulse-density modulated signal to an analog signal, and comparing it to a monitored supply voltage;
responsive to detecting a droop in the monitored supply voltage below a designated value relative to the analog signal, producing a droop detection signal; and
responsive to the droop detection signal, causing a digital frequency-locked loop (DFLL) that provides a clock signal for synchronizing circuitry within a domain of the monitored supply voltage to slow the clock signal.

12. The method of claim 11, further comprising, responsive to the droop detection signal, gating the clock signal for a designated period of time.

13. The method of claim 11, further comprising, responsive to the droop detection signal, controlling a latch to hold the droop detection signal for a designated period of time following a droop detection circuit no longer detecting the droop, and reset the droop detection signal following the designated period of time.

14. The method of claim 11, further comprising, after slowing the clock signal, increasing a speed of the clock signal in designated periodic increments over time.

15. The method of claim 14 further comprising setting a DFLL increment amount for controlling how quickly the DFLL increases the speed of the clock signal after the clock signal is slowed.

16. The method of claim 11 further comprising
receiving the droop detection signal and one or more additional clock stretch request signals at a DFLL control circuit; and
at the DFLL control circuit, determining which of the droop detection signal and the one or more additional clock stretch request signals shall determine how much to slow the clock signal.

17. The method of claim 11, further comprising:
incrementing a counter value while a droop is detected and decrementing the counter value while a droop is not detected; and
responsive to the counter value exceeding a designated threshold, providing a signal indicating a potential electrical design current (EDC) event exists that may violate a peak current constraint.

18. A data processing system, comprising:
an integrated circuit including at least two processor tiles each comprising digital logic, a local DFLL providing a clock signal for synchronizing the digital logic, and a local power supply monitor for monitoring a respective monitored local supply voltage, each power supply monitor comprising:
a reference signal generator that receives a digital value and produces a pulse-density modulated signal based on the digital value;
a droop detection circuit that converts the pulse-density modulated signal to an analog signal, compares the analog signal to the respective monitored local supply voltage, and responsive to detecting a droop of the respective monitored local supply voltage below a designated value relative to the analog signal, produces a droop detection signal; and
a DFLL control circuit that, responsive to receiving the droop detection signal, causes the local DFLL to slow the clock signal.

19. The data processing system of claim 18, wherein each processor tile further comprises:
- a clock gate coupled to the local DFLL for gating the clock signal; and
- a latch with an input receiving the droop detection signal and an output coupled to the clock gate for gating the clock signal responsive to the droop detection signal.

20. The data processing system of claim 19, wherein each processor tile further comprises a state machine having an input receiving the droop detection signal, and an output coupled to control the latch, wherein the state machine controls the latch to hold the droop detection signal for a designated period of time following the droop detection circuit no longer detecting the droop, and reset the droop detection signal following the designated period of time.

21. The data processing system of claim 18, wherein each DFLL control circuit comprises:
- a first input receiving the droop detection signal;
- one or more additional inputs each receiving a clock stretch request signal from a respective additional circuit in the integrated circuit; and
- arbitration logic for selecting which of the droop detection signal and the one or more additional inputs shall determine how much to slow the local DFLL.

22. The data processing system of claim 18, wherein the DFLL control circuit is further operable to set a DFLL increment amount at the local DFLL for controlling how quickly the local DFLL increases a speed of the clock signal after the clock signal is slowed.

23. The data processing system of claim 18, wherein the droop detection circuit includes a level shifter for converting the pulse-density modulated signal to be referenced to a clean supply voltage.

24. The data processing system of claim 18, wherein the droop detection circuit includes a comparator comprising a series of inverters including at least a first complimentary-metal-oxide-semiconductor (CMOS) inverter and a second CMOS inverter each including a positive supply terminal receiving the respective monitored local supply voltage, the first CMOS inverter including an input receiving the analog signal, the first CMOS inverter configured to operate in a crowbar mode when the respective monitored local supply voltage is near a designated level.

25. The data processing system of claim 18, wherein at least one of the processor tiles further comprises:
- a counter receiving the droop detection signal from the comparator, the counter including a counter value that increments while the droop detection signal indicates a droop is detected and decrements while the droop detection signal indicates a droop is not detected; and
- a control circuit comparing the counter value to a threshold and responsive to the counter value exceeding the threshold, providing a signal indicating a potential electrical design current (EDC) event exists that may violate a peak current constraint for the integrated circuit.

* * * * *